United States Patent
Tarrab et al.

[11] Patent Number: 5,966,029
[45] Date of Patent: Oct. 12, 1999

[54] MULTI-BIT EXCLUSIVE OR

[75] Inventors: Moshe Tarrab, Holon; Eytan Engel, Rosh-Haain; Natan Baron, Oranit; Dan Kuzmin, Haifa, all of Israel

[73] Assignee: Motorola, Inc., Schaumburg, Ill.

[21] Appl. No.: 08/893,043

[22] Filed: Jul. 15, 1997

[51] Int. Cl.$^6$ ..................................................... H03K 19/21
[52] U.S. Cl. ................................................. 326/52; 326/53
[58] Field of Search ......................... 326/52, 53; 327/116, 327/119

[56] References Cited

U.S. PATENT DOCUMENTS

| | | | |
|---|---|---|---|
| 4,251,884 | 2/1981 | Baun, Jr. | 371/49 |
| 4,958,353 | 9/1990 | Greiner et al. | 371/49.4 |
| 5,191,243 | 3/1993 | Shen et al. | 326/52 |
| 5,247,525 | 9/1993 | Taira et al. | 371/22.4 |
| 5,523,707 | 6/1996 | Levy et al. | 326/52 |

FOREIGN PATENT DOCUMENTS

| | | |
|---|---|---|
| 456475A3 | 5/1993 | European Pat. Off. . |
| 280914B1 | 11/1995 | European Pat. Off. . |
| 1413726 | 7/1988 | U.S.S.R. . |

*Primary Examiner*—Tuan T. Lam
*Attorney, Agent, or Firm*—Robert M. Handy; Lanny L. Parker

[57] ABSTRACT

The present invention relates to multi-bit exclusive-or (XOR) gates (60), including those where N parallel input bits (36, 38) are XORed with one data input bit (52). A modular approach is made using only one basic cell (30) for various implementations with different propagation delays. An N-bit XOR comprises basic cells (30) of adjacent first and second XOR gates (32, 34). Each first XOR gate (32) processes as input two of said N primary input bits (36, 38) and each second XOR gate (34) processes as input bits output bits of first or second XOR gates (32, 34) or the input data bit (52). This structure makes it possible to create an array of identical basic cells which is very suitable for VLSI implementation. There are few lines of connections between the different cells in the cell array which leads to substantial reduction in propagation delay without adding substantial wiring or layout complexity.

11 Claims, 3 Drawing Sheets

MULTI-BIT EXCLUSIVE OR

FIELD OF THE INVENTION

The present invention relates to means and methods for performing multi-bit exclusive OR (XOR) operations, including those where N parallel input bits are XORed with one data input bit.

BACKGROUND OF THE INVENTION

In the electronic arts it is often desired to perform a unary exclusive OR (XOR) process on N parallel input bits together with a data input bit. This processing of N+1 bits is done by combining N two-bit exclusive OR gates in a suitable manner. One can choose between a complicated and fast circuit or a simple circuit which needs up to N unit propagation delays and therefore is very slow.

FIG. 1 illustrates prior art multi-bit XOR 10 comprising N two-bit XORs 12 arranged in a tree structure. N parallel input bits 14 are XORed in pairs in N/2 two-bit XORs 12 which form a first group acting in parallel. The output bits of this first group are fed to a second group acting in parallel, and so on. The last (Nth) XOR 16 in the propagation flow direction performs an XOR operation with result 18 of all N parallel input bits and the data input bit. Its output is the desired multi-bit XOR result.

The advantage of this tree structure is a short propagation delay, since the number of stages in the propagation path is $\log_2 N$. The disadvantage is that the interconnections are complex making it less suitable for VLSI implementation.

FIG. 2 shows prior art multi-bit XOR 20 with N two-bit XORs 12' arranged in a line. Similar reference numbers (12, 12') are used to identify the like or analogous elements. N parallel input bits 14 are XORed serially with the data input. It is said that the data input bit ripples through N stages.

The advantage of this serial structure is that its modularity and simple connectivity makes it very suitable for VLSI implementation. The disadvantage is the very long propagation delay of N serial stages.

DETAILED DESCRIPTION OF THE PREFERRED EMBODIMENT

Figure 3:
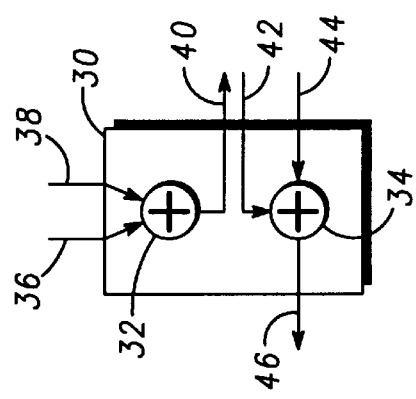
FIG. 3 is a simplified schematic diagram of a basic cell according to the present invention.

FIG. 3 is a simplified schematic diagram of basic cell 30 according to the present invention. Basic cell 30 is the basic unit of a modular approach whereby various implementations of N-bit XOR use this basic element. Basic cell 30 comprises first XOR gate 32 and second XOR gate 34. It is desirable but not essential that XOR gates 32, 34 be in close proximity, preferably adjacent in the circuit layout. First XOR gate 32 processes in parallel two primary input bits 36, 38 and outputs their XOR result 40. Second XOR gate 34 processes its input bits 42, 44 and outputs their XOR result 46. Basic cell 30 is shown in a specific way to illustrate that first XOR gate 32 has parallel inputs and second XOR gate 34 is a serial stage where input bit 44 ripples through.

Figure 2:
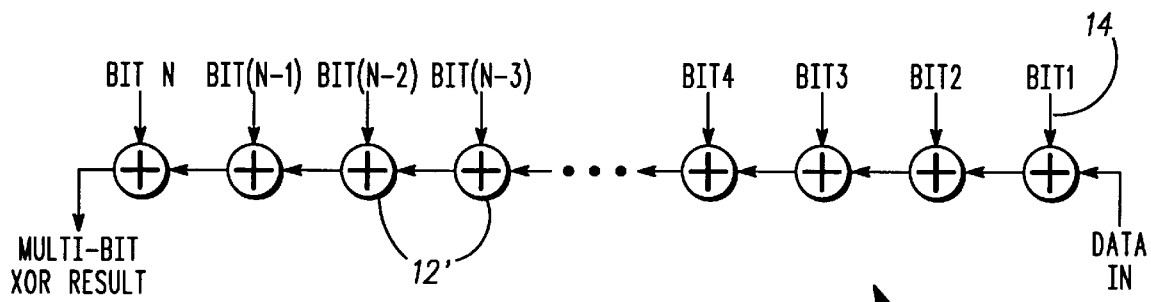
FIG. 2 is a simplified schematic diagram of a serial multi-bit XOR gate according to the prior art.
Figure 4:
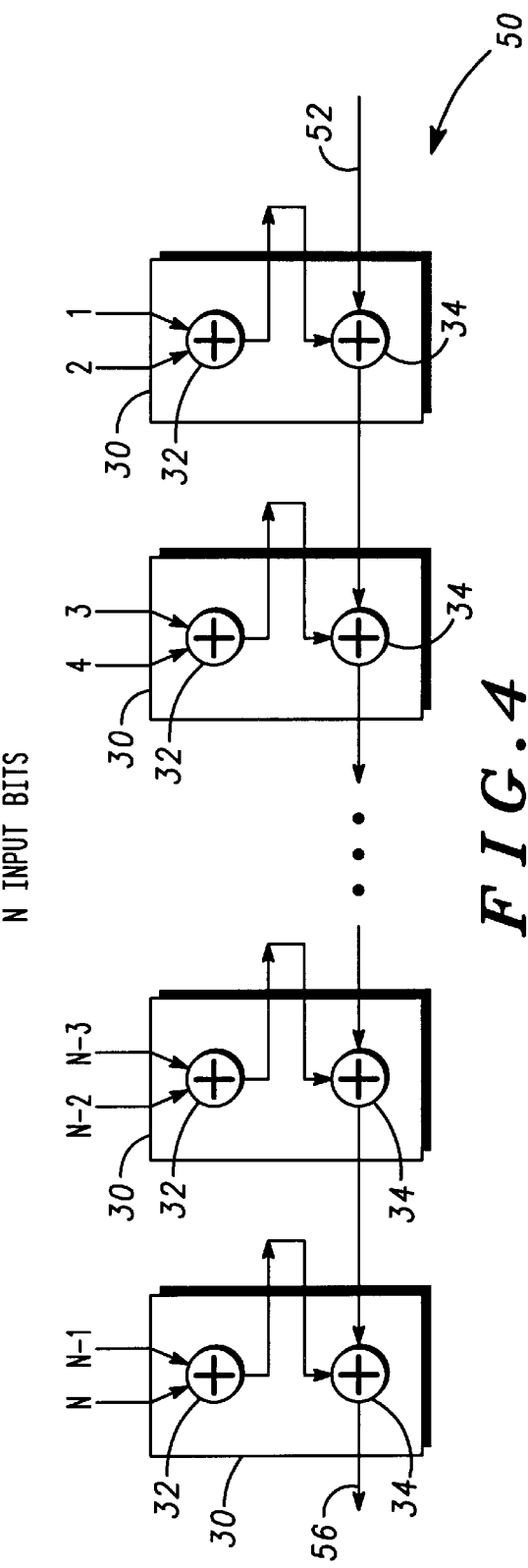
FIG. 4 is a simplified schematic diagram of a multi-bit XOR gate using basic cells according to the present invention.

FIG. 4 is a simplified schematic diagram of multi-bit XOR gate 50 using basic cells 30 according to the present invention. This is an N-bit XOR gate wherein N/2 basic cells 30 form N/2 serial stages. First XOR 32 of each cell has as primary input, two of the N parallel input bits. The second XORs of all cells are arranged in series such that first XOR 32 of each cell 30 forms a logical tree structure feeding into second XOR 34 of each stage. Data input bit 52 ripples through the N/2 serial stages of all second XORs 34 where it is XORed with the result of all N parallel input bits to obtain output 56. There is a reduction in propagation delay by a factor of ½ compared to the prior art N-bit XOR gate of FIG. 2 but it still has the benefit of a simple connectivity.

Figure 5:
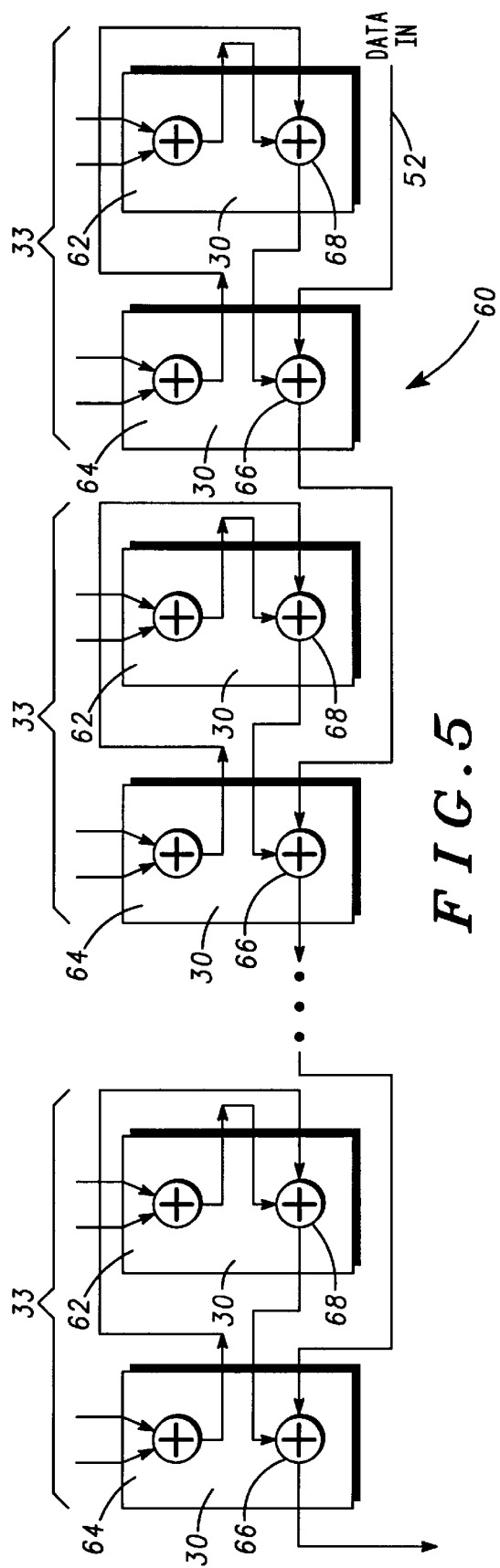
FIG. 5 is a simplified schematic diagram of a multi-bit XOR gate using basic cells according to another embodiment of the present invention.

FIG. 5 is another simplified schematic diagram of multi-bit XOR gate 60 using basic cells 30 according to a further embodiment of the present invention. N/2 basic cells 30 form N/4 serial stages 33, each stage 33 having first basic cells 62 and second basic cells 64. Other than interconnections cells 62 and 64 are basic cells 30. Last XORs 66 of all stages 33 are arranged in series. Other XORs 32, 68 of each stage 33 form a logical tree structure feeding into last XOR 66 of each stage 33. First XORs 32 of first and second basic cells 62, 64 process primary input of two bits each and both feed into second XOR 68 of first basic cell 62 which feeds into the second XOR 66 of second basic cell 64.

Figure 6:
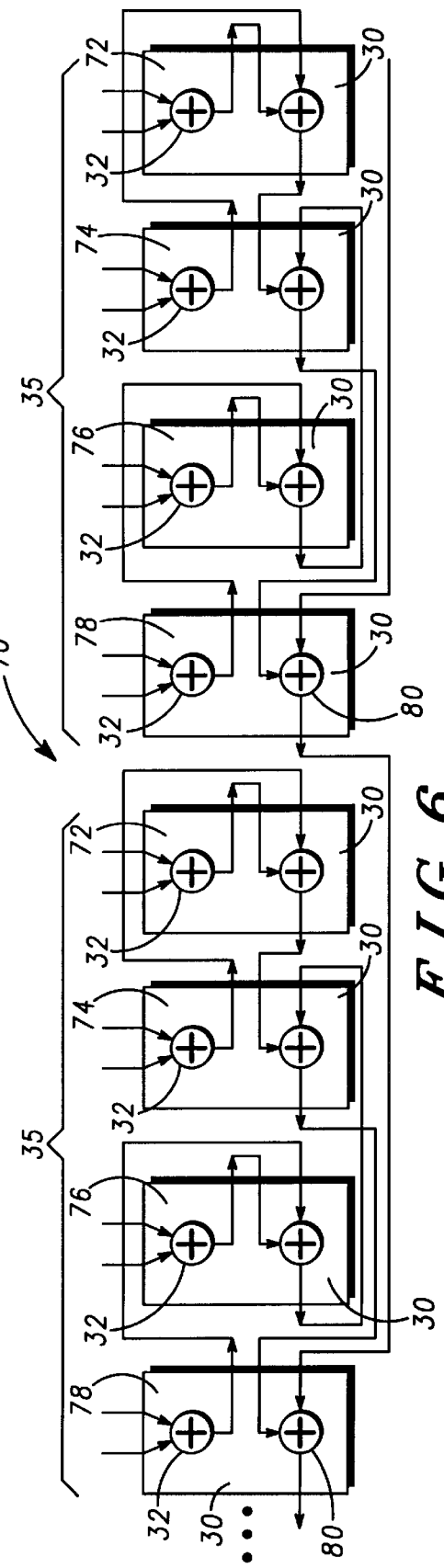
FIG. 6 is a simplified schematic diagram of a multi-bit XOR gate using basic cells according to still another embodiment of the present invention.

FIG. 6 is a simplified schematic diagram of multi-bit XOR gate 70 using basic cells 30 according to a still further embodiment of the present invention. N/2 basic cells 30 form N/8 serial stages 35, each having first to fourth basic cells 72, 74, 76, 78 of basic cells 30. Last XORs 80 of all stages are arranged in series, and the other XORs of each stage form a logical tree structure. First XORs 32 of the first to fourth basic cells process primary input of two bits each, first XORs of first and second basic cells 72, 74 feed into second XOR 34 of first basic cell 72. First XORs of third and fourth basic cells 76, 78 feed into second XOR 34 of third basic cell 76. Second XORs 34 of first and third basic cells 72, 76 feed into second XOR 34 of second basic cell 74 which feeds into second XOR 80 of fourth basic cell 78.

According to this invention, an XOR operation with a primary input of N parallel bits and one data bit is performed in two steps:

(i) XOR-processing of N/k bits of primary parallel input in k groups, k being greater than one and less than or equal to N/2, each group forming a group XOR tree with a one-bit group XOR result, and (ii) serial XOR-processing of k group XOR results with said data bit.

With the embodiments described above shown in FIGS. 4, 5, and 6, this is performed in k=N/2, N/4 and N/8 groups, respectively. Each group forms an XOR tree of 1, 3 and 7 XORs containing at least all basic cells 30 first XOR gates 32. Each group XOR tree provides an one-bit group XOR result which is serially XOR-processed with the data bit 52 by last XORs 34, 66 and 80, respectively, of each group. The number of basic cells 30 per group is given by n=N/(2 k). Thus, in FIGS. 4, 5, 6, n=1, 2, 4, respectively. While various values of k and n are illustrated in FIGS. 4–6, those of skill in the art will understand based on the teachings herein that other values of k and n can also be used.

Figure 1:
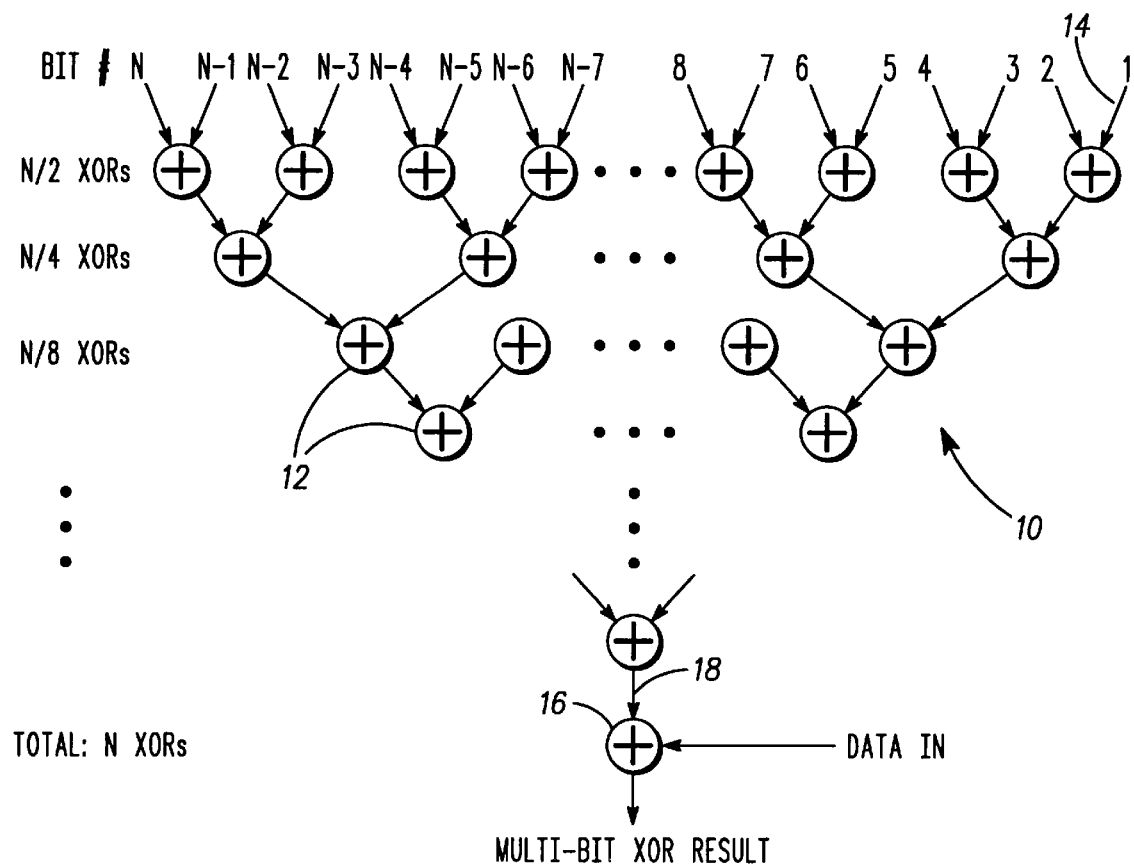
FIG. 1 is a simplified schematic diagram of a tree structure multi-bit XOR gate according to the prior art.

FIGS. 4, 5, and 6, demonstrate modularity and simpler connectivity for a multi-bit XOR implementation. Only one basic cell (e.g. basic cell 30) is used for all various implementations with different interconnection and propagation delays. The basic cell is designed so that its physical width covers two input bits and the cells are placed desirably in a linear or sequential or serial array. This structure makes it very suitable for VLSI implementation. It uses only a few lines of connections between the different cells in the array which leads to a substantial reduction in propagation delay without adding substantial interconnection complexity. Thus, the invented arrangement provides for a significant reduction in propagation delay compared to prior art serial arrangement of FIG. 2 without introducing the very complex connectivity required by the prior art tree structure on FIG. 1.

A person skilled in the art will understand based on the description herein that the present invention is also of great use for applications with N parallel input bits having no data bit and/or where N is not a power of two. In another embodiment (not shown) where twenty-four parallel input bits are XORed, twelve basic cells are used in a manner described above. Larger or smaller numbers of bits can also be used. Further a constant voltage corresponding to a logical zero or one can be fed to an input of a basic cell's second XOR instead of a data input bit as in the embodiments above. A person skilled in the art can choose the constant voltage corresponding to the logical zero or one based on whether an inversion of the N bit XOR result is desired.

In the foregoing detailed description of the preferred embodiment, reference is made to the accompanying drawings which form a part hereof, and in which are shown by way of illustration specific embodiments in which the invention may be practiced. These embodiments have been described in sufficient detail to enable those skilled in the art to practice the invention, and it is to be understood that other embodiments may be utilized and that logical, mechanical and electrical changes can be made without departing from the spirit and scope of the present invention. The foregoing detailed description is, therefore, not to be taken in a limiting sense, and the scope of the present inventions is defined only by the appended claims.

We claim:

1. An apparatus having therein an N-bit XOR using k serial stages wherein each serial stage comprises N/(2 k) basic cells of first and second XORs, wherein last XORs of all stages are arranged in series, and other XORs of each of said k stages form a logical tree structure feeding into the last XOR of each stage.

2. The apparatus of claim 1 wherein the first XOR of each basic cell processes a primary input for two bits.

3. The apparatus of claim 1 wherein N/2 basic cells form N/2 serial stages, the second XORs of all basic cells being arranged in series, the first XOR of each basic cell forming a logical tree structure feeding into the last XOR of each stage.

4. The apparatus of claim 1 wherein N/2 basic cells form N/4 serial stages with first and second basic cells each, the last XORs of all stages being arranged in series, and the other XORs of each stage forming a logical tree structure feeding into the last XOR of each stage.

5. The apparatus of claim 4 wherein the first XORs of the first and second basic cells process primary input of two bits each and both feed into the second XOR of the first basic cell which feeds into the second XOR of the second basic cell.

6. The apparatus of claim 1 wherein N/2 basic cells form N/8 serial stages with first to fourth basic cells each, the last XORs of all stages being arranged in series, and the other XORs of each stage forming a logical tree structure feeding into the last XOR of each stage.

7. The apparatus of claim 6 wherein the first XORs of the first to fourth basic cells process primary input of two bits each, the first XORs of the first and second basic cells feed into the second XOR of the first basic cell, the first XORs of the third and fourth basic cells feed into the second XOR of the third basic cell, and the second XORs of the first and third basic cells feed into the second XOR of the second basic cell which feeds into the second XOR of the fourth basic cell.

8. The apparatus of claim 1 wherein the first and second XORs of each of said basic cells are substantially adjacent in the circuit layout.

9. An apparatus for performing an N-bit XOR with an input data bit, comprising two basic cells each having first and second XOR gates, wherein each first XOR gate receives as input bits two of N primary input bits and one of the second XOR gates receives input bits from outputs of the first XOR gates of the two basic cells and provides a first input bit to the other second XOR gate, where the other second XOR gate receives the input data bit.

10. A method for performing an N-bit XOR with one data bit comprising the steps of:

(i) XOR-processing of N/k bits of primary parallel input in k groups, k being greater than one and less than or equal N/2, each group forming a group XOR tree with a one-bit group XOR result, and (ii) serial XOR-processing of k group XOR results with said data bit.

11. The method of claim 10 using N/2 basic cells of first and second XOR gates, XOR-processing of N primary input bits according to step (i) being performed with N/2 first XOR gates and step (ii) being performed with k second XOR gates.

* * * * *